(12) United States Patent
Musha

(10) Patent No.: US 6,265,861 B1
(45) Date of Patent: Jul. 24, 2001

(54) FREQUENCY SPECTRUM ANALYZER WITH HIGH C/N RATIO

(75) Inventor: Hirobumi Musha, Gyoda (JP)

(73) Assignee: Advantest Corp., Tokyo (JP)

(*) Notice: Subject to any disclaimer, the term of this patent is extended or adjusted under 35 U.S.C. 154(b) by 0 days.

(21) Appl. No.: 09/482,761

(22) Filed: Jan. 13, 2000

Related U.S. Application Data

(63) Continuation of application No. 09/170,301, filed on Oct. 13, 1999.

(30) Foreign Application Priority Data

Oct. 20, 1997 (JP) .................................................. 9-287106

(51) Int. Cl.⁷ .................................................. G01R 13/24
(52) U.S. Cl. ...................................... 324/76.23; 324/76.27
(58) Field of Search ........................... 324/76.23, 76.27, 324/76.29, 76.19, 613, 614

(56) References Cited

U.S. PATENT DOCUMENTS

| | | | |
|---|---|---|---|
| 3,868,568 | * 2/1975 | Ashida et al. | 324/76.27 |
| 4,408,284 | * 10/1983 | Kijesky et al. | 702/77 |
| 4,716,362 | * 12/1987 | Ambos et al. | 324/76.23 |
| 5,179,344 | * 1/1993 | Najle et al. | 324/613 |
| 5,633,809 | * 5/1997 | Wissenback et al. | 702/45 |
| 5,736,845 | * 4/1998 | Kosuge | 324/76.27 |

* cited by examiner

Primary Examiner—Safet Metjahic
Assistant Examiner—Vincent Q. Nguyen
(74) Attorney, Agent, or Firm—Muramatsu & Associates

(57) ABSTRACT

A frequency spectrum analyzer having an improved carrier to noise ration for analyzing frequency spectrum of an input signal. The spectrum analyzer includes a first frequency converter formed of a first frequency mixer, a first IF (intermediate frequency) filter and a first local signal oscillator; a second frequency converter; a third frequency converter formed of a third frequency mixer, a third IF filter and a third local signal oscillator; a frequency divider for diving a frequency of the first local signal by a factor of N; a frequency multiplier for multiplying a frequency of the third local signal; a fourth frequency mixer which is provided with a divided frequency signal from the frequency divider as a fourth local signal; and a fifth frequency mixer which mixes the input signal to be analyzed and a multiplied frequency signal from the frequency multiplier as a fifth local signal and provides a frequency converted input signal to the fourth frequency mixer; where the fourth frequency mixer mixes the fourth local signal and the frequency converted input signal and provides a resultant IF signal to the third frequency converter.

16 Claims, 3 Drawing Sheets

FREQUENCY SPECTRUM ANALYZER WITH HIGH C/N RATIO

This application is a continuation of U.S. application Ser. No. 09/170,301 filed Oct. 13, 1999.

FIELD OF THE INVENTION

This invention relates to a frequency spectrum analyzer for analyzing frequency spectrum of an input signal, and more particularly, to a frequency spectrum analyzer having a high carrier wave to noise (C/N) ratio for analyzing frequency spectrum of an input signal with a wide dynamic range, high resolution, and low noise.

BACKGROUND OF THE INVENTION

Frequency spectrum analyzers are widely used for analyzing frequency spectrum of an incoming signal in a frequency domain. Typically in such a frequency spectrum analyzer, levels of frequency spectrum are displayed in a vertical direction with respect to a frequency range in a horizontal direction. A frequency spectrum analyzer includes three or more frequency converters connected in series each of which is formed of a frequency mixer, a local oscillator and a band pass filter to produce intermediate frequency (IF) signals without image (spurious) responses.

An example of conventional frequency spectrum analyzer is shown in FIG. 3. The frequency spectrum analyzer of FIG. 3 includes three frequency converters. The first frequency converter is formed of a first frequency mixer 11, a first IF filter 21 and a first local oscillator 31. The second frequency converter is formed of a second frequency mixer 12, a second IF filter 22 and a second local oscillator 32. The third frequency converter is formed of a third frequency mixer 13, a third IF filter 23 and a third local oscillator 33. The frequency spectrum analyzer further includes a ramp wave generator 50, a detector 60 and a display 70.

Typically, the first local oscillator 31 is a sweep frequency oscillator whose frequency is linearly swept by a ramp wave from the ramp wave generator. The second and third local oscillators are fixed frequency oscillators. The frequency of the first local signal is higher than that of the second and third local signals.

An input signal F1 to be analyzed is mixed with the first local signal by the first frequency mixer 11, thereby producing first IF signals having both sum and difference frequencies between the input and first local signals. The first IF filter 21, which is a band pass filter, selects either one of the sum or difference IF signals from the first frequency mixer 11.

Thus, the first IF signal is provided to the second frequency mixer 12 where it is mixed with the second local signal from the second local oscillator 32. The second frequency mixer produces second IF signals having both sum and difference frequencies between the first IF signal and the second local signal. The second IF filter 22, which is a band pass filter, selects either one of the sum or difference IF signals from the second frequency mixer 12.

Similarly, the second IF signal is provided to the third frequency mixer 13 where it is mixed with the third local signal from the third local oscillator 33. The third frequency mixer produces third IF signals having both sum and difference frequencies between the second IF signal and the third local signal. The third IF filter 23, which is a band pass filter, selects either one of the sum or difference IF signals from the third frequency mixer 13.

The third IF signal from the third IF filter 23 is provided to the detector 60 where a DC voltage proportional to the AC power level of the third IF signal is produced. The DC voltage is provided to the display 70 where it is displayed in a vertical axis as a power level. Since the ramp wave is also applied to the display 70 for driving a horizontal axis thereof, the display screen shows frequency spectrum of the input signal F1 in a frequency domain. In such a frequency domain analysis, the power level is shown in the vertical direction while the frequency range (span) is shown in the horizontal direction.

As briefly mentioned above, a frequency spectrum analyzer employs such multiple stages of frequency converters for eliminating image frequencies (spurious responses) by selecting appropriate frequencies in the local signals and IF signals. Further to eliminating the spurious responses, it is also important for a frequency spectrum analyzer to have a high carrier wave to noise (C/N) ratio to analyze an input signal with high sensitivity and resolution.

As is well known in the art, a C/N ratio of a spectrum analyzer is determined by C/N ratios (purity) of local signals used therein. This is because phase noise of local oscillators is usually larger than noise floors of other components in the spectrum analyzer. It is also known in the art that a C/N ratio of a fixed frequency oscillator is higher than that of a sweep frequency oscillator. Further, an oscillator having a highly selective resonant circuit such as a crystal oscillator has a higher C/N ratio than other types of oscillators.

In the arrangement of FIG. 3, the first local oscillator 31 is a wide range sweep oscillator typically using a YIG resonator. The second and third local oscillators 32 and 33 are fixed frequency oscillators. A crystal oscillator with high stability is usually used as the third local oscillator 33. Thus, generally, degrees of phase noise in the first to third local oscillators will be expressed in the following order:

$$\phi_{LO1} > \phi_{LO2} > \phi_{LO3} \tag{1}$$

where $\phi_{LO1}$ denotes the phase noise of the first local oscillator 31, $\phi_{LO2}$ denotes the phase noise of the second local oscillator 32, and $\phi_{LO3}$ denotes the phase noise of the third local oscillator 33.

When the noise floor of other components in the spectrum analyzer is lower than the phase noise of local oscillators, and the phase noise of the local oscillators is random noise, overall phase noise $\phi_N$ of the frequency spectrum analyzer will be expressed as follows:

$$\phi_N = ((\phi_{LO1})^2 + (\phi_{LO2})^2 + (\phi_{LO3})^2)^{1/2} \tag{2}$$

Since the phase noise of the first local oscillator 31 is the largest, the equation (2) is written to:

$$\phi_N \approx \phi_{LO1} \tag{3}$$

Thus, the C/N ratio of the frequency spectrum analyzer is almost equal to the C/N ratio of the first local oscillator 31. Since the first local oscillator 31 is a wide range sweep oscillator, typically a YIG tuned voltage controlled oscillator, which is expensive and is difficult to further decrease its phase noise.

SUMMARY OF THE INVENTION

Therefore, it is an object of the present invention to provide a frequency spectrum analyzer having an overall noise level which is significantly lower than the noise level in the conventional spectrum analyzer.

It is another object of the present invention to provide a frequency spectrum analyzer which is capable of improving the carrier to noise (C/N) ratio by employing a relatively simple and small circuit.

It is a further object of the present invention to provide a frequency spectrum analyzer which is capable of analyzing frequency spectrum of an input signal with a wide dynamic range and high resolution.

It is a further object of the present invention to provide a frequency spectrum analyzer which is capable of switching between a high C/N ratio mode with a relatively small frequency range and a conventional frequency spectrum analyzer mode.

In the frequency spectrum analyzer of the present invention, the frequency of the first local oscillator is divided by the ratio of N before being mixed with the input signal to be analyzed. Accordingly, the overall carrier wave to noise (C/N) ratio of the spectrum analyzer is improved by the factor of division ratio N.

In the first embodiment of the present invention, the frequency spectrum analyzer for analyzing frequency spectrum of an input signal is comprised of: a first frequency converter formed of a first frequency mixer, a first IF (intermediate frequency) filter and a first local signal oscillator to produce a first IF signal; a second frequency converter which receives the first IF signal and formed of a second frequency mixer, a second IF filter and a second local signal oscillator to produce a second IF signal; a third frequency converter which receives the second IF signal and formed of a third frequency mixer, a third IF filter and a third local signal oscillator to produce a third IF signal which is displayed as frequency spectrum of the input signal; a frequency divider for diving a frequency of the first local signal by a factor of N; a frequency multiplier for multiplying a frequency of the third local signal; a fourth frequency mixer which is provided with a divided frequency signal from the frequency divider as a fourth local signal; and a fifth frequency mixer which mixes the input signal to be analyzed and a multiplied frequency signal from the frequency multiplier as a fifth local signal and provides a frequency converted input signal to the fourth frequency mixer; wherein the fourth frequency mixer mixes the fourth local signal and the frequency converted input signal and provides a resultant IF signal to the third frequency converter.

In the second embodiment of the present invention, the local signal supplied to the fifth frequency mixer is produced by a phase lock loop rather than the frequency multiplier of the first embodiment. The second embodiment can be achieved with lesser cost than the first embodiment since it does not need the frequency multiplier and the associated band pass filter.

DETAILED DESCRIPTION OF THE PREFERRED EMBODIMENT

Figure 1:
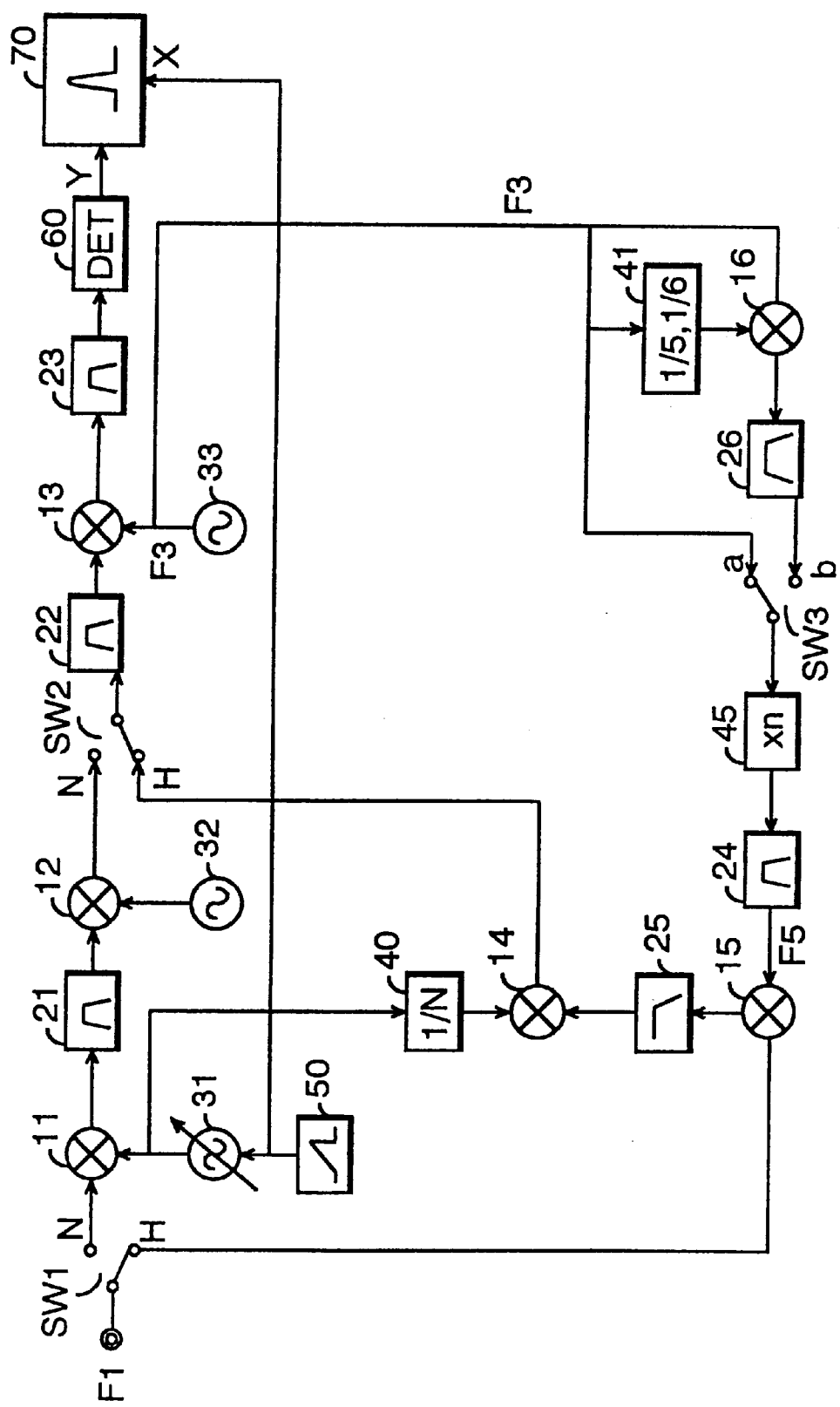
FIG. 1 is a block diagram showing an example of structure of the frequency spectrum analyzer according to the present invention.

The first embodiment of the present invention will be described with reference to FIG. 1. In the example of FIG. 1, the frequency spectrum analyzer of the present invention includes six frequency converters. The first to third frequency converters are the same as that of the conventional example of FIG. 3.

Namely, the first frequency converter is formed of a first frequency mixer 11, a first IF (intermediate frequency) filter 21 and a first local oscillator 31 and produces a first IF signal. The second frequency converter is formed of a second frequency mixer 12, a second IF filter 22 and a second local oscillator 32 and produces a second IF signal. The third frequency converter is formed of a third frequency mixer 13, a third IF filter 23 and a third local oscillator 33 and produces a third IF signal.

The fourth frequency converter is formed of a frequency mixer 14 and a frequency divider 40 which divides the frequency of the first local oscillator 31 by N. The fifth frequency converter is formed of a frequency mixer 15, a frequency multiplier 45 which multiplies the frequency of the third local oscillator 33 by n, a band pass filter 24 and a low pass filter 25. The sixth frequency converter is formed of a frequency mixer 16, the third local oscillator 33, a programmable frequency divider 41 which divides the frequency of the third local oscillator 33 by a specified rate, and a band pass filter 26.

The example of FIG. 1 further includes switches SW1, SW2 and SW3. When the switches SW1 and SW2 are set to terminals N, the frequency spectrum analyzer of FIG. 1 has the same configuration as that of FIG. 3. When the switches SW1 and SW2 are set to terminals H, the high C/N ratio is achieve by the present invention. Similar to the conventional example of FIG. 3, the frequency spectrum analyzer further includes a ramp wave generator 50, a detector 60 and a display 70.

In the following, the operation of the present invention is explained in the situation where the switches SW1 and SW2 are set to terminals H, and the switch SW3 is set to a terminal a in FIG. 1.

An input signal F1 to be analyzed is converted its frequency by the frequency mixer 15 which mixes the input signal F1 and a fifth local signal F5 from the frequency multiplier 45 through the band pass filter 24. The fifth local signal to the mixer 15 has a frequency which is n times higher than the frequency of the third local signal oscillator 33. The frequency mixer 15 produces a fourth IF signal which is provided to the frequency mixer 14 through the low pass filter 25.

The frequency mixer 14 mixes the fourth IF signal and a fourth local signal from the frequency divider 40. The fourth local signal to the frequency mixer 14 has a frequency which is 1/N of the first local signal oscillator 31. The frequency mixer 14 provides a fifth IF signal having the same frequency as that of the second IF signal to the second IF filter 22. Thus, the fifth IF signal is mixed with the third local signal by the third frequency mixer 13 and converted to the third IF signal. The third IF signal is detected its amplitude by the detector 60 and supplied to the display 70 where it is displayed as frequency spectrum.

In the arrangement of FIG. 1, it is assumed that the noise floor of other components in the spectrum analyzer is lower than the phase noise of the local oscillators, and the phase noise of the local oscillators is random noise. Then, the overall phase noise $\phi_H$ of the frequency spectrum analyzer will be expressed as follows:

$$\phi_H = ((\phi_{LO4})^2 + (\phi_{LO3})^2 + (\phi_{LO5})^2)^{1/2} \tag{4}$$

In the equation (4), $\phi_{LO4}$ denotes the phase noise of the fourth local signal derived from the divider 40 which divides the first local signal by N, i.e., $\phi_{LO4}=(1/N)\phi_{LO1}$. Further, $\phi_{LO5}$ denotes the phase noise of the fifth local signal F5 derived from the frequency multiplier 45 which multiplies the third local signal by n times, i.e., $\phi_{LO5}=n\phi_{LO3}$. Thus, the equation (4) is expressed as follows:

$$\phi_H=(((1/N)\times\phi_{LO1})^2+(1+n^2)\times\phi_{LO3}^2)^{1/2} \quad (5)$$

If the relationship in the expression (6) below is applicable, the equation (5) will be rewritten to the equation (7) as follows:

$$(((1/N)\times\phi_{LO1})^2>(1+n^2)\times\phi_{LO3}^2)^{1/2} \quad (6)$$

$$\phi_H\approx(1/N)\times\phi_{LO1} \quad (7)$$

The equation (7) means that the phase noise of the spectrum analyzer is reduced by 1/N, i.e, the C/N ratio of the spectrum analyzer is increased by N times.

Figure 3:
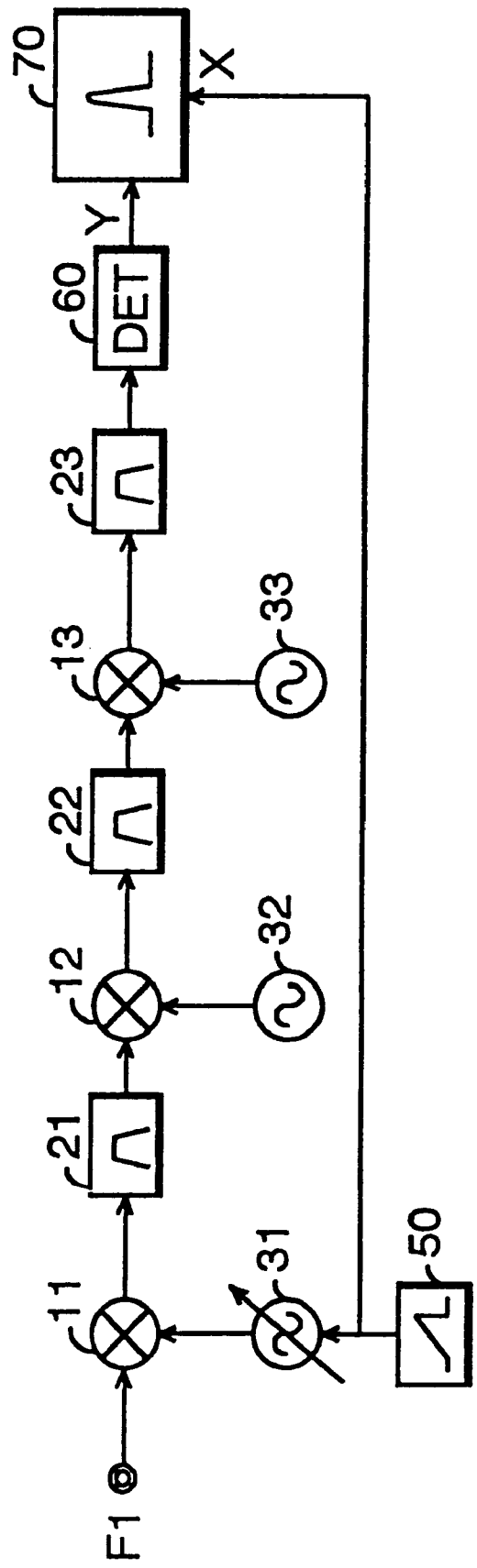
FIG. 3 is a block diagram showing an example of structure of the frequency spectrum analyzer in the conventional technology.

More specifically, the first local oscillator 31 is a wide range sweep oscillator typically using a YIG resonator having a C/N ratio of 100 dBc/Hz at 10 kHz offset. The second local oscillator 32 is a fixed frequency oscillator such as a dielectric resonance oscillator having a C/N ratio of 110 dBc/Hz at 10 kHz offset, and the third local oscillator 33 is a fixed frequency crystal oscillator having a C/N ratio of 145 dBc/Hz at 10 kHz offset. Thus, the overall C/N ratio in the conventional example of FIG. 3 is 100 dBc/Hz or less, since the phase noise of the first local oscillator controls the overall phase noise.

In the present invention of FIG. 1, applying these C/N ratios of the local oscillators in the equation (5), the overall phase noise becomes significantly lower than that of the first local oscillator 31. For example, when the division rate is N=16, and the multiplier rate is n=9, the overall C/N ratio becomes 124 dBc/Hz, which is better than the conventional frequency spectrum analyzer by 24 dB.

When the switch 3 is connected to the terminal as noted above, there arises a situation where the frequency of the input signal is equal to the frequency of the fifth local, resulting in no IF signal from the frequency mixer 15. In such a situation, the frequency spectrum analysis for the input signal is unavailable.

To solve this problem, the switch 3 is set to the terminal b to shift the frequency of the fifth local signal to the frequency mixer 15. The frequency of the third local oscillator 33 is divided by the programmable divider 41 into ⅕ or ⅙ of the original frequency. The output of the programmable divider 41 is mixed with the original third local signal in the frequency mixer 16 to produce, for example, (1+⅕) of the third local signal frequency. The shifted frequency local signal is supplied to the frequency multiplier 45 through the filter 26 and is multiplied by n to produce the fifth local signal F5' whose frequency is different from that of the input signal F1. Accordingly, the frequency mixer 15 produces an IF signal to be provided to the frequency mixer 14.

In the present invention described above, although the C/N ratio dramatically improves, the input frequency range to be analyzed is reduced because of the decrease in the sweep frequency range of the local signal applied to the frequency mixer 14. In the case where the user wants to analyze the input signal with wider frequency range, the switches 1 and 2 are set to the terminals N to achieve the operation of the conventional frequency spectrum analyzer.

Figure 2:
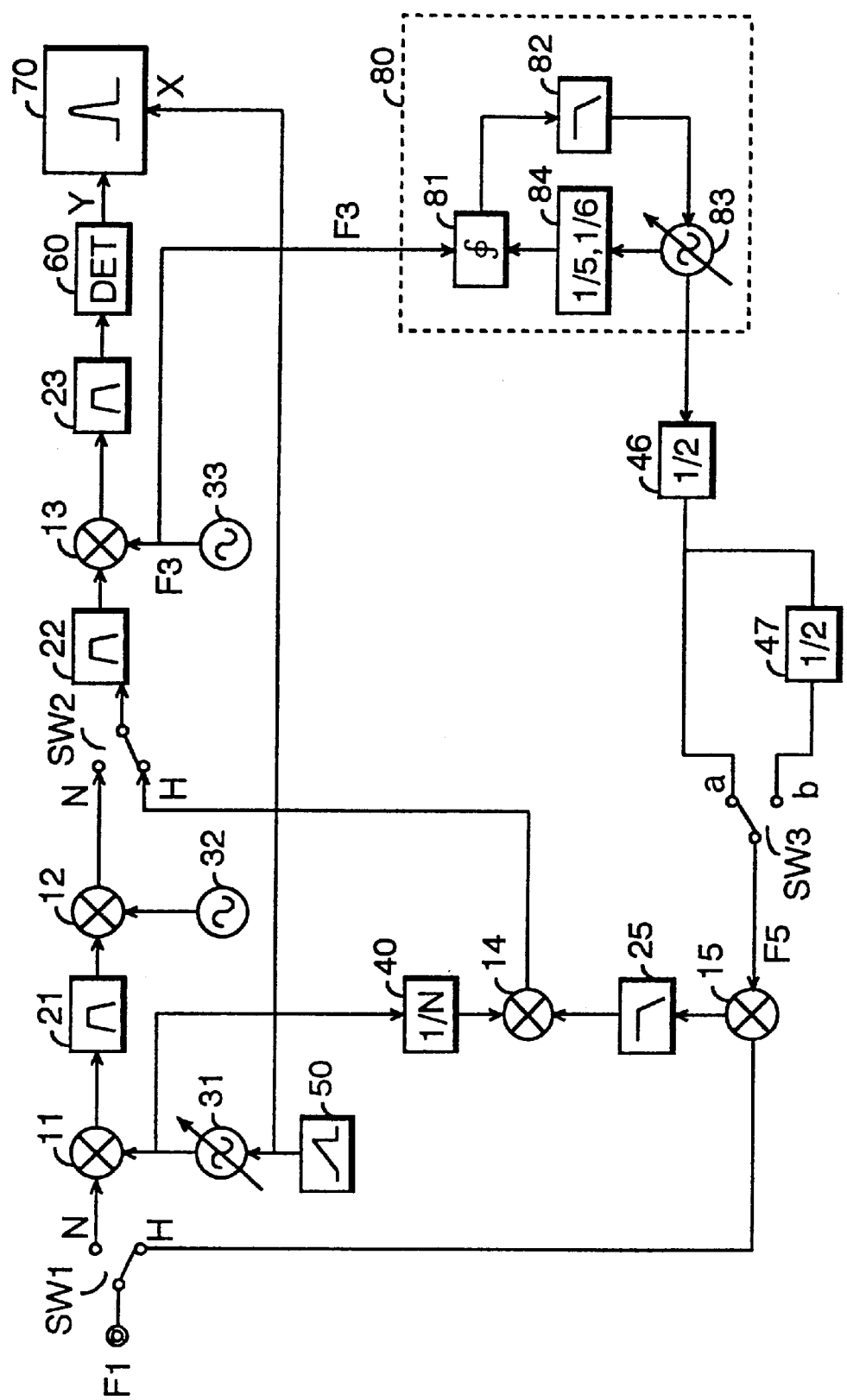
FIG. 2 is a block diagram showing another example of structure of the frequency spectrum analyzer according to the present invention.

The second embodiment of the present invention will be described with reference to FIG. 2. In the example of FIG. 2, the local signal supplied to the frequency mixer 15 is produced by a circuit configuration different from that of the first embodiment. In creating the fifth local signal F5 to the frequency mixer 15, the second embodiment employs a phase lock loop (PLL) 80 rather than the multiplier 45 in the first embodiment. The example of FIG. 2 further includes frequency dividers 46 and 47.

The PLL 80 is formed of a phase comparator 81, a programmable divider 84, a loop filter 82 and a voltage controlled oscillator 83. The voltage controlled oscillator 83 is, for example, a dielectric resonance oscillator whose oscillation frequency is controlled by a control voltage from the loop filter 82. The oscillation frequency is divided by the programmable divider 84 having a dividing ration of ⅕, for example, and is given to the phase comparator 81. The phase comparator 81 compares the phases of the signal from the programmable divider 84 and the third local signal F3 and generates a difference signal representing the phase difference between the two. The loop filter 82 defines the closed loop characteristics by filtering the difference signal to provide the control signal to the voltage controlled oscillator 83.

By the negative feedback loop of the PLL, the voltage controlled oscillator 83 generates a local signal which has a frequency five times higher than the third local signal F3 while its phase is locked to the phase of the third local signal F3. The output frequency of the voltage controlled oscillator 83 is divided by the frequency divider 46 and is supplied to the frequency mixer 15 as the fifth local signal F5. Similar to the first embodiment, to avoid the situation where the input signal F1 and the fifth local F5 have the same frequency, the switch 3 is provided to set to the terminal b to shift the frequency in such a situation.

In the arrangement of FIG. 2, the overall carrier wave to noise (C/N) ratio is improved by the factor of dividing ratio N as in the same manner described with reference to FIG. 1. It is considered that the example of FIG. 2 can be achieved with less cost than the example of FIG. 1 since it does not need the frequency multiplier and the associated band pass filter.

As has been foregoing, according to the present invention, the frequency spectrum analyzer is capable of significantly reducing the overall phase noise by dividing the frequency of the first local oscillator. The frequency spectrum analyzer of the present invention can improve the carrier to noise (C/N) ratio by using an additional circuit of relatively simple and low cost.

Thus, the frequency spectrum analyzer of the present invention is capable of analyzing frequency spectrum of input signal with a wide dynamic range and high resolution. Moreover, the frequency spectrum analyzer of the present invention can switch between the high C/N ratio mode with a relatively small frequency range and the conventional frequency spectrum analyzer mode.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A spectrum analyzer for analyzing frequency spectrum of an input signal, comprising:
    a first frequency converter formed of a first frequency mixer, a first IF (intermediate frequency) filter and a first local signal oscillator to produce a first IF signal;
    a second frequency converter which receives the first IF signal and formed of a second frequency mixer, a second IF filter and a second local signal oscillator to produce a second IF signal;

a third frequency converter which receives the second IF signal and formed of a third frequency mixer, a third IF filter and a third local signal oscillator to produce a third IF signal which is displayed as frequency spectrum of the input signal;

a frequency divider for diving a frequency of the first local signal by a factor of N;

a frequency multiplier for multiplying a frequency of the third local signal;

a fourth frequency mixer which is provided with a divided frequency signal from the frequency divider as a fourth local signal; and a fifth frequency mixer which mixes the input signal to be analyzed and a multiplied frequency signal from the frequency multiplier as a fifth local signal and provides a frequency converted input signal to the fourth frequency mixer;

wherein the fourth frequency mixer mixes the fourth local signal and the frequency converted input signal and provides a resultant IF signal to the third frequency converter.

2. A spectrum analyzer as defined in claim 1, further comprising:

a first switch for selectively providing the input signal to be analyzed to the first frequency mixer or to the fifth frequency mixer; and a second switch for selectively providing the second IF signal or the IF signal from the fourth frequency mixer to the third frequency converter;

whereby changing between a normal spectrum analysis mode and a high C/N (carrier/noise) ratio mode.

3. A spectrum analyzer as defined in claim 1, wherein the first local oscillator is a sweep frequency oscillator whose frequency is linearly changed by a ramp signal, and the second and third local oscillators are fixed frequency oscillators whose frequencies are unchanged.

4. A spectrum analyzer as defined in claim 1, wherein the first local oscillator is a sweep frequency oscillator having a YIG resonator whose frequency is linearly changed by a ramp signal, the second local oscillator is a fixed frequency oscillator having a dielectric resonator whose frequency is unchanged, and the third local oscillator is a crystal oscillator whose frequency is unchanged.

5. A spectrum analyzer as defined in claim 1, wherein an amplitude of the third IF signal is detected by a detector and is provided to a vertical axis of a display while a ramp signal which sweeps the frequency of the first local oscillator is simultaneously provided to a horizontal axis of the display.

6. A spectrum analyzer as defined in claim 1, further comprising means for shifting the frequency of the fifth local signal in the case where frequencies of the input signal and the fifth local signal are identical.

7. A spectrum analyzer as defined in claim 6, wherein the frequency shifting means comprising:

a second frequency divider for dividing the frequency of the third local signal;

a sixth frequency mixer for mixing the third local oscillator and the a frequency divided output of the second frequency divider to produce a frequency shifted local signal to be given to the frequency multiplier; and a third switch for selectively providing the third local oscillator or the frequency shifted local signal .from the sixth frequency mixer to the fifth frequency mixer.

8. A spectrum analyzer for analyzing frequency spectrum of an input signal, comprising:

a first frequency converter formed of a first frequency mixer, a first IF (intermediate frequency) filter and a first local signal oscillator to produce a first IF signal;

a second frequency converter which receives the first IF signal and formed of a second frequency mixer, a second IF filter and a second local signal oscillator to produce a second IF signal;

a third frequency converter which receives the second IF signal and formed of a third frequency mixer, a third IF filter and a third local signal oscillator to produce a third IF signal which is displayed as frequency spectrum of the input signal;

a frequency divider for diving a frequency of the first local signal by a factor of N;

a phase lock loop (PLL) circuit for generating a phase locked signal which has a frequency of predetermined times higher than that of the third local signal;

a fourth frequency mixer which is provided with a divided frequency signal from the frequency divider as a fourth local signal; and a fifth frequency mixer which mixes the input signal to be analyzed and the phase locked signal from the PLL circuit as a fifth local signal and provides a frequency converted input signal to the fourth frequency mixer;

wherein the fourth frequency mixer mixes the fourth local signal and the frequency converted input signal and provides a resultant IF signal to the third frequency converter.

9. A spectrum analyzer as defined in claim 8, further comprising:

a first switch for selectively providing the input signal to be analyzed to the first frequency mixer or to the fifth frequency mixer; and a second switch for selectively providing the second IF signal or the IF signal from the fourth frequency mixer to the third frequency converter;

whereby changing between a normal spectrum analysis mode and a high C/N (carrier/noise) ratio mode.

10. A spectrum analyzer as defined in claim 8, wherein the first local oscillator is a sweep frequency oscillator whose frequency is linearly changed by a ramp signal, and the second and third local oscillators are fixed frequency oscillators whose frequencies are unchanged.

11. A spectrum analyzer as defined in claim 8, wherein the first local oscillator is a sweep frequency oscillator having a YIG resonator whose frequency is linearly changed by a ramp signal, the second local oscillator is a fixed frequency oscillator having a dielectric resonator whose frequency is unchanged, and the third local oscillator is a crystal oscillator whose frequency is unchanged.

12. A spectrum analyzer as defined in claim 8, wherein an amplitude of the third IF signal is detected by a detector and is provided to a vertical axis of a display while a ramp signal which sweeps the frequency of the first local oscillator is simultaneously provided to a horizontal axis of the display.

13. A spectrum analyzer as defined in claim 8, wherein the PLL circuit comprising:

a voltage controlled oscillator whose frequency is controlled by a control voltage supplied thereto;

a frequency divider for dividing the frequency of an oscillation signal of the voltage controlled oscillator by a predetermined division factor;

a phase comparator which receives the third local signal and an output of the frequency divider and compares a phase difference between the two signals and produces a difference signal representing the phase difference; and a loop filter for defining a loop response of PLL circuit by filtering the difference signal to provide the control voltage to the voltage controlled oscillator.

14. A spectrum analyzer as defined in claim 13, wherein the voltage controlled oscillator is a dielectric resonance oscillator.

15. A spectrum analyzer as defined in claim 8, further comprising means for shifting the frequency of the fifth local signal in the case where frequencies of the input signal and the fifth local signal are identical.

16. A spectrum analyzer as defined in claim 15, wherein the frequency shifting means comprising:
 a second frequency divider for dividing the frequency of the phase locked signal from the PLL circuit; and
 a third switch for selectively providing the phase locked signal from the PLL circuit or the frequency shifted signal from the second frequency divider to the fifth frequency mixer.

* * * * *